US010879496B2

(12) United States Patent
Morimoto et al.

(10) Patent No.: US 10,879,496 B2
(45) Date of Patent: Dec. 29, 2020

(54) ORGANIC ELECTROLUMINESCENT ELEMENT HAVING A CHARGE GENERATING LAYER BETWEEN ADJACENT LIGHT EMITTING LAYERS

(71) Applicant: LUMIOTEC INC., Yonezawa (JP)

(72) Inventors: Mitsuru Morimoto, Yonezawa (JP); Junichi Tanaka, Yonezawa (JP)

(73) Assignee: LUMIOTEC INC., Yonezawa (JP)

( * ) Notice: Subject to any disclaimer, the term of this patent is extended or adjusted under 35 U.S.C. 154(b) by 0 days.

(21) Appl. No.: 16/093,397

(22) PCT Filed: Apr. 14, 2017

(86) PCT No.: PCT/JP2017/015268
§ 371 (c)(1),
(2) Date: Oct. 12, 2018

(87) PCT Pub. No.: WO2017/179692
PCT Pub. Date: Oct. 19, 2017

(65) Prior Publication Data
US 2019/0148676 A1    May 16, 2019

(30) Foreign Application Priority Data

Apr. 14, 2016 (JP) .................................. 2016-081204

(51) Int. Cl.
*H01L 29/08* (2006.01)
*H01L 31/0203* (2014.01)
(Continued)

(52) U.S. Cl.
CPC ............ *H01L 51/5278* (2013.01); *F21K 2/00* (2013.01); *H01L 27/3209* (2013.01);
(Continued)

(58) Field of Classification Search
CPC ............. H01L 51/5278; H01L 51/0072; H01L 51/5016; H01L 51/504; H01L 51/5044;
(Continued)

(56) References Cited

U.S. PATENT DOCUMENTS 7,955,709 B2 * 6/2011 Jeong .................. H01L 51/5265
427/66
9,484,545 B2 * 11/2016 Morimoto ............. H01L 51/504
(Continued)

FOREIGN PATENT DOCUMENTS

CN          101989647 A       3/2011
CN          102097455 A       6/2011
(Continued)

OTHER PUBLICATIONS

International Search Report for PCT/JP2017/015268 (PCT/ISA/210) dated Jun. 6, 2017.
(Continued)

*Primary Examiner* — Alonzo Chambliss
(74) *Attorney, Agent, or Firm* — Birch, Stewart, Kolasch & Birch, LLP

(57) ABSTRACT

This organic EL element comprises a first light emitting unit that contains a red phosphorescent light emitting layer and a green phosphorescent light emitting layer, a second light emitting unit that contains a blue fluorescent light emitting layer, and a third light emitting unit that contains a blue fluorescent light emitting layer; and this organic EL element has a structure in which a positive electrode, the third light emitting unit, a second charge generating layer, the second light emitting unit, a first charge generating layer, the first light emitting unit and a negative electrode are sequentially laminated in this order. The white light obtained through light emission of the first, second and third light emitting units has one peak wavelength within the red wavelength
(Continued)

| CATHODE 100nm |
| --- |
| ELECTRON TRANSPORT LAYER 68nm |
| GREEN PHOSPHORESCENT LIGHT EMITTING LAYER   20nm   20% |
| RED PHOSPHORESCENT LIGHT EMITTING LAYER   10nm   2% |
| HOLE TRANSPORT LAYER 30nm |
| CHARGE GENERATING LAYER 6.3nm |
| ELECTRON TRANSPORT LAYER 15nm |
| BLUE FLUORESCENT LIGHT EMITTING LAYER   25nm   5% |
| HOLE TRANSPORT LAYER 40nm |
| CHARGE GENERATING LAYER 6.3nm |
| ELECTRON TRANSPORT LAYER 25nm |
| BLUE FLUORESCENT LIGHT EMITTING LAYER   25nm   5% |
| HOLE TRANSPORT LAYER 65nm |
| ANODE 100nm | range, one peak wavelength within the green wavelength range, and one or two peak wavelengths within the blue wavelength range.

14 Claims, 12 Drawing Sheets

(51) Int. Cl.
*H01L 21/00* (2006.01)
*H01L 51/40* (2006.01)
*H01L 51/52* (2006.01)
*F21K 2/00* (2006.01)
*H01L 51/50* (2006.01)
*H01L 27/32* (2006.01)
*H01L 51/00* (2006.01)

(52) U.S. Cl.
CPC ...... *H01L 27/3211* (2013.01); *H01L 51/0072* (2013.01); *H01L 51/504* (2013.01); *H01L 51/5012* (2013.01); *H01L 51/5016* (2013.01); *H01L 51/5044* (2013.01); *H01L 51/5056* (2013.01); *H01L 51/5072* (2013.01); *H01L 51/5092* (2013.01); *H01L 51/5206* (2013.01); *H01L 51/5221* (2013.01)

(58) Field of Classification Search
CPC ............. H01L 51/5056; H01L 51/5072; H01L 51/5092; H01L 51/5206; H01L 51/5221; H01L 27/3209; H01L 27/3211; H01L 61/504; H01L 51/5012
See application file for complete search history.

(56) References Cited

U.S. PATENT DOCUMENTS

| | | | |
|---|---|---|---|
| 2003/0189401 A1 | 10/2003 | Kido et al. | |
| 2006/0081840 A1* | 4/2006 | Mori | H01L 51/5088 257/40 |
| 2007/0200124 A1 | 8/2007 | Suzuri et al. | |
| 2011/0031476 A1 | 2/2011 | Oda et al. | |
| 2011/0133227 A1 | 6/2011 | Lee et al. | |
| 2012/0132895 A1* | 5/2012 | Kido | H01L 51/5278 257/40 |
| 2012/0211728 A1 | 8/2012 | Ushikubo et al. | |
| 2014/0084269 A1 | 3/2014 | Weaver et al. | |
| 2015/0155513 A1 | 6/2015 | Pieh et al. | |
| 2016/0351836 A1* | 12/2016 | Forrest | H01L 51/0087 |
| 2017/0200911 A1 | 7/2017 | Morimoto et al. | |
| 2017/0237031 A1* | 8/2017 | Kim | H01L 51/5278 257/40 |
| 2019/0288228 A1* | 9/2019 | Pieh | H01L 51/5265 |
| 2019/0319209 A1* | 10/2019 | Tanaka | H05B 33/04 |

FOREIGN PATENT DOCUMENTS

| | | |
|---|---|---|
| EP | 2330651 A2 | 6/2011 |
| EP | 2869355 A1 | 5/2015 |
| JP | 2003-272860 A | 9/2003 |
| JP | 2006-287154 A | 10/2006 |
| JP | 2009-224274 A | 10/2009 |
| JP | 2012-028792 A | 2/2012 |
| JP | 2012-160476 A | 8/2012 |
| JP | 2013-254749 A | 12/2013 |
| JP | 2015-109278 A | 6/2015 |
| JP | 2016-024956 A | 2/2016 |
| JP | 2016-029667 A | 3/2016 |
| WO | WO 2006/008977 A1 | 1/2006 |
| WO | WO 2006/009024 A1 | 1/2006 |
| WO | WO 2016/009991 A1 | 1/2016 |

OTHER PUBLICATIONS

Tang et al., "Organic electroluminescent diodes", Applied Physics Letters, vol. 51, Sep. 21, 1987, pp. 913-915.
Extended European Search Report for European Application No. 17782505.6, dated Oct. 22, 2019.
Chinese Office Action and Search Report for Chinese Application No. 201780023405.9, dated Nov. 28, 2019, with English translation.

* cited by examiner

Fig. 3

| CATHODE 100nm |
| --- |
| ELECTRON TRANSPORT LAYER 68nm |
| GREEN PHOSPHORESCENT LIGHT EMITTING LAYER  20nm  20% |
| RED PHOSPHORESCENT LIGHT EMITTING LAYER  10nm  2% |
| HOLE TRANSPORT LAYER  30nm |
| CHARGE GENERATING LAYER  6.3nm |
| ELECTRON TRANSPORT LAYER  15nm |
| BLUE FLUORESCENT LIGHT EMITTING LAYER  25nm  5% |
| HOLE TRANSPORT LAYER  40nm |
| CHARGE GENERATING LAYER  6.3nm |
| ELECTRON TRANSPORT LAYER  25nm |
| BLUE FLUORESCENT LIGHT EMITTING LAYER  25nm  5% |
| HOLE TRANSPORT LAYER  65nm |
| ANODE 100nm |

Fig. 5

| CATHODE 100nm |
| --- |
| ELECTRON TRANSPORT LAYER 68nm |
| GREEN PHOSPHORESCENT LIGHT EMITTING LAYER 20nm 20% |
| RED PHOSPHORESCENT LIGHT EMITTING LAYER 10nm 2% |
| HOLE TRANSPORT LAYER 30nm |
| CHARGE GENERATING LAYER 6.3nm |
| ELECTRON TRANSPORT LAYER 15nm |
| BLUE FLUORESCENT LIGHT EMITTING LAYER 25nm 8% |
| HOLE TRANSPORT LAYER 40nm |
| CHARGE GENERATING LAYER 6.3nm |
| ELECTRON TRANSPORT LAYER 25nm |
| BLUE FLUORESCENT LIGHT EMITTING LAYER 25nm 8% |
| HOLE TRANSPORT LAYER 65nm |
| ANODE 100nm |

Fig. 7

| CATHODE 100nm |
| --- |
| ELECTRON TRANSPORT LAYER 68nm |
| GREEN PHOSPHORESCENT LIGHT EMITTING LAYER 20nm 20% |
| RED PHOSPHORESCENT LIGHT EMITTING LAYER 10nm 2% |
| HOLE TRANSPORT LAYER 30nm |
| CHARGE GENERATING LAYER 6.3nm |
| ELECTRON TRANSPORT LAYER 15nm |
| BLUE FLUORESCENT LIGHT EMITTING LAYER 25nm 5% |
| HOLE TRANSPORT LAYER 40nm |
| CHARGE GENERATING LAYER 6.3nm |
| ELECTRON TRANSPORT LAYER 25nm |
| BLUE FLUORESCENT LIGHT EMITTING LAYER 25nm 5% |
| HOLE TRANSPORT LAYER 65nm |
| ANODE 100nm |

Fig. 9

| |
|---|
| CATHODE 100nm |
| ELECTRON TRANSPORT LAYER 68nm |
| GREEN PHOSPHORESCENT LIGHT EMITTING LAYER 20nm 20% |
| RED PHOSPHORESCENT LIGHT EMITTING LAYER 10nm 2% |
| HOLE TRANSPORT LAYER 35nm |
| CHARGE GENERATING LAYER 6.3nm |
| ELECTRON TRANSPORT LAYER 15nm |
| BLUE FLUORESCENT LIGHT EMITTING LAYER 25nm 5% |
| HOLE TRANSPORT LAYER 45nm |
| CHARGE GENERATING LAYER 6.3nm |
| ELECTRON TRANSPORT LAYER 15nm |
| BLUE FLUORESCENT LIGHT EMITTING LAYER 25nm 5% |
| HOLE TRANSPORT LAYER 65nm |
| ANODE 100nm |

Fig.11

| CATHODE 100nm |
|---|
| ELECTRON TRANSPORT LAYER 68nm |
| GREEN PHOSPHORESCENT LIGHT EMITTING LAYER 20nm 20% |
| RED PHOSPHORESCENT LIGHT EMITTING LAYER 10nm 2% |
| HOLE TRANSPORT LAYER 30nm |
| CHARGE GENERATING LAYER 6.3nm |
| ELECTRON TRANSPORT LAYER 15nm |
| BLUE FLUORESCENT LIGHT EMITTING LAYER 25nm 5% |
| HOLE TRANSPORT LAYER 40nm |
| CHARGE GENERATING LAYER 6.3nm |
| ELECTRON TRANSPORT LAYER 25nm |
| BLUE FLUORESCENT LIGHT EMITTING LAYER 25nm 5% |
| HOLE TRANSPORT LAYER 65nm |
| ANODE 100nm |

| CATHODE 100nm |
| --- |
| ELECTRON TRANSPORT LAYER 50nm |
| GREEN PHOSPHORESCENT LIGHT EMITTING LAYER 20nm 20% |
| RED PHOSPHORESCENT LIGHT EMITTING LAYER 10nm 2% |
| HOLE TRANSPORT LAYER 40nm |
| CHARGE GENERATING LAYER 11.6nm |
| ELECTRON TRANSPORT LAYER 25nm |
| BLUE FLUORESCENT LIGHT EMITTING LAYER 25nm 5% |
| HOLE TRANSPORT LAYER 105nm |
| ANODE 300nm |

ORGANIC ELECTROLUMINESCENT ELEMENT HAVING A CHARGE GENERATING LAYER BETWEEN ADJACENT LIGHT EMITTING LAYERS

TECHNICAL FIELD

The present invention relates to an organic electroluminescent (EL) element and a lighting device.

The present application claims the benefit of priority of Japanese Patent Application No. 2016-081204 filed on Apr. 14, 2016, the entire contents of which are incorporated herein by reference.

BACKGROUND ART

An organic EL element is a self-luminous element including a light emitting layer made of an organic compound between a cathode and an anode facing each other. When voltage is applied between the cathode and the anode, electrons injected into the light emitting layer from the cathode side and holes injected into the light emitting layer from the anode side recombine in the light emitting layer to generate excitons and light is emitted by this excitons.

In order to increase the efficiency of the organic EL element, Tang et al. of Eastman Kodak Company made a structure in which: organic compounds varying in carrier transport properties were stacked one on top of another to inject electrons and holes from the cathode and the anode in a balanced manner; and the layer thickness of the organic layer provided between the cathode and the anode was set to be 200 nm or less, and thereby succeeded in achieving high luminance and high efficiency of 1000 cd/m$^2$ and an external quantum efficiency of 1% at an application voltage of 10 V or less, which is sufficient for practical use (see, for example, Non-patent Document 1).

The organic EL element has been developed based on the aforementioned element structure proposed by Tang et al. Moreover, as an element structure of the organic EL element, there is developed an organic EL element with a multiphoton emission (MPE) structure in which a light emitting unit including at least one light emitting layer is included as a unit and an electrically-insulating charge generating layer (CGL) is disposed between multiple light emitting units (see, for example, Patent Document 1). In this organic EL element with the MPE structure, when voltage is applied between the cathode and the anode, charges in a charge transfer complex move toward each of the cathode side and the anode side and this causes holes to be injected into one light emitting unit located on the cathode side of the charge generating layer and causes electrons to be injected into another light emitting unit located on the anode side of the charge generating layer. The multiple light emitting units can thereby emit light with the same current amount. Thus, current efficiency and external quantum efficiency multiplied by the number of the light emitting units can be achieved.

The organic EL element having a tandem structure as described above is attracting attention as a technique which can achieve long life, high luminance, and uniform light emission in a large area unachievable in the organic EL element structure of Tang et al.

The aforementioned organic EL element has such characteristics that high speed switching of light emission is possible and its simple element structure allows a smaller thickness. The organic EL element is applied to display devices of, for example, cellular phones and vehicle devices by utilizing such excellent characteristics. Moreover, in recent years, the organic EL element has been attracting attention as a lighting device such as, for example, a back light of a liquid crystal display and a general lighting unit by utilizing the characteristics such as surface emission and a thin structure.

When the organic EL element is applied to a lighting device, the organic EL element needs to provide white light with a high color temperature and an excellent color rendering property. Methods of causing the organic EL element to provide white light include a method of providing white color by mixing colors of light beams emitted from materials which emit light beams of two complementary colors such as, for example, blue light emitting layer and a yellow light emitting layer, a method of providing a white color by mixing colors of light beams emitted by three light emitting layers of red, blue, and green, and the like.

Among these, the method of mixing colors of light beams emitted by three light emitting layers of red, blue, and green is suitable for providing white light with the excellent color rendering property (see, for example, Patent Documents 2 and 3).

However, in the conventional organic EL element, an emission spectrum of white light provided by light emission of the three light emitting layers of red, blue, and green is not necessarily sufficiently controlled from the viewpoint of achieving the high color temperature and the excellent color rendering property. In other words, the conventional organic EL element does not necessarily have a sufficient performance as a light source of a lighting device.

PRIOR ART DOCUMENT

Patent Document

Patent Document 1: Japanese Patent Application Publication No. 2003-272860
Patent Document 2: Japanese Patent Application Publication No. 2006-287154
Patent Document 3: Japanese Patent Application Publication No. 2009-224274

Non-Patent Document

Non-Patent Document 1: Appl. Phys. Lett., 51, 913 (1987).

SUMMARY OF THE INVENTION

Problems to be Solved by the Invention

The present invention is proposed in view of the existing situations described above and an object thereof is to provide an organic electroluminescent element which can provide white light with a high color temperature and an excellent color rendering property and which can also achieve high luminance light emission and long life drive, thereby being preferably used particularly as a light source of a lighting device, and a lighting device including this organic electroluminescent element.

Means for Solving the Problems

In order to achieve the aforementioned object, the present invention provides the following means.
(1) An organic electroluminescent element having a structure in which a plurality of light emitting units each including a light emitting layer made of at least an organic compound are stacked one on top of another between a cathode and an anode and a charge generating layer is sandwiched between each pair of the adjacent light emitting units, the organic electroluminescent element capable of providing white light by causing the plurality of light emitting units to emit light, comprising:

a first light emitting unit including a light emitting layer formed of a red phosphorescent light emitting layer which emits red light with one peak wavelength in a red wavelength band and a green phosphorescent light emitting layer which emits green light with one peak wavelength in a green wavelength band;

a second light emitting unit including a light emitting layer formed of a blue fluorescent light emitting layer which emits blue light with one or two peak wavelengths in a blue wavelength band; and a third light emitting unit including a light emitting layer formed of a blue fluorescent light emitting layer which emits blue light with one or two peak wavelengths in the blue wavelength band, wherein the organic electroluminescent element has a structure in which:

the first light emitting unit and the second light emitting unit are stacked one on top of the other with a first charge generating layer sandwiched therebetween and the second light emitting unit and the third light emitting unit are stacked one on top of the other with a second charge generating layer sandwiched therebetween; and the anode, the third light emitting unit, the second charge generating layer, the second light emitting unit, the first charge generating layer, the first light emitting unit, and the cathode are stacked one on top of another in this order, and the white light provided by light emission of the first light emitting unit, the second light emitting unit, and the third light emitting unit has an emission spectrum continuous over a wavelength band of at least 380 nm to 780 nm and the emission spectrum has one peak wavelength in a red wavelength band of 590 nm to 640 nm, one peak wavelength in a green wavelength band of 500 nm to 550 nm, one or two peak wavelengths in a blue wavelength band of 440 nm to 490 nm.

(2) The organic electroluminescent element according to (1), wherein the emission spectrum has one bottom wavelength in a blue wavelength band and a green wavelength band of 500 nm to 520 nm.

(3) The organic electroluminescent element according to (2), wherein an emission intensity of the one bottom wavelength in the blue wavelength band and the green wavelength band of 500 nm to 520 nm is lower than emission intensities of bottom wavelengths in the other wavelength bands.

(4) The organic electroluminescent element according to (2) or (3), wherein a ratio of (B) to (A) ((B)/(A)) is 0.50 or smaller, where (A) is an emission intensity of a peak wavelength having the highest emission intensity in the wavelength band of 380 nm to 780 nm and (B) is an emission intensity of the one bottom wavelength in the blue wavelength band and the green wavelength band of 500 nm to 520 nm.

(5) The organic electroluminescent element according to any one of (2) to (4), wherein an interval between the one bottom wavelength in the blue wavelength band and the green wavelength band of 500 nm to 520 nm and one bottom wavelength between the peak wavelengths adjacent to each other in the red wavelength band and the green wavelength band is 50 nm or more.

(6) The organic electroluminescent element according to any one of (1) to (5), wherein an emitted light color of the white light is daylight (D) among chromaticity ranges specified in "JIS Z 9112" and an average color rendering index (Ra) of the white light is 70 or more.

(7) The organic electroluminescent element according to any one of (1) to (6), wherein the charge generating layers are each formed of an electrically insulating layer made of an electron accepting material and an electron donating material and a specific resistance of the electrically insulating layer is $1.0 \times 10^2$ Ω·cm or more.

(8) The organic electroluminescent element according to (7), wherein the specific resistance of the electrically insulating layer is $1.0 \times 10$ Ω·cm or more.

(9) The organic electroluminescent element according to any one of (1) to (6), wherein each of the charge generating layers is formed of mixed layers of different materials, one component of the mixed layers is a metal oxide, and the metal oxide forms a charge transfer complex by redox, and when voltage is applied between the cathode and the anode, charges in the charge transfer complex move toward each of the cathode side and the anode side to cause holes to be injected into one light emitting unit located on the cathode side of the charge generating layer and cause electrons to be injected into another light emitting unit located on the anode side of the charge generating layer.

(10) The organic electroluminescent element according to any one of claims (7) to (9), wherein each of the charge generating layers is formed of a laminate of an electron accepting material and an electron donating material, and when voltage is applied between the cathode and the anode, in an interface between the electron accepting material and the electron donating material, charges generated by reaction involving movement of electrons between the electron accepting material and the electron donating material move toward each of the cathode side and the anode side to cause holes to be injected into one light emitting unit located on the cathode side of the charge generating layer and cause electrons to be injected into another light emitting unit located on the anode side of the charge generating layer.

(11) The organic electroluminescent element according to any one of (1) to (10), wherein the charge generating layers contain a compound having a structure expressed by the following formula (1):

[Chem. 1]

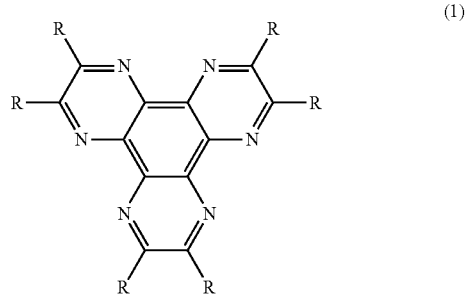

(1)

where R represents an electron withdrawing group of F, Cl, Br, I, CN, CF$_3$.

(12) A lighting device comprising the organic electroluminescent element according to anyone of (1) to (11).

(13) The lighting device according to (12), comprising an optical film on a light extraction surface side of the organic electroluminescent element.

(14) The lighting device according to (12) or (13), wherein an emitted light color of the white light is one of daylight (D), neutral white (N), and white (W) among chromaticity ranges specified in "JIS Z 9112" and an average color rendering index (Ra) of the white light is 80 or more.

(15) The lighting device according to any one of claims 12 to 14, wherein R13 and R15 among color rendering indices of the white light are each 70 or more.

Effect of the Invention

The present invention can provide an organic electroluminescent element which can provide white light with a high color temperature and an excellent color rendering property and a lighting device including this organic electroluminescent element.

BRIEF DESCRIPTION OF THE DRAWINGS

FIG. 3 is a cross-sectional view illustrating an element structure of an organic EL element in Example 1.

FIG. 5 is a cross-sectional view illustrating an element structure of an organic EL element in Example 2.

FIG. 7 is a cross-sectional view illustrating an element structure of a lighting device in Example 5.

FIG. 9 is a cross-sectional view illustrating an element structure of a lighting device in Example 6.

FIG. 11 is a cross-sectional view illustrating an element structure of a lighting device in Example 7.

MODE FOR CARRYING OUT THE INVENTION

Figure 1:
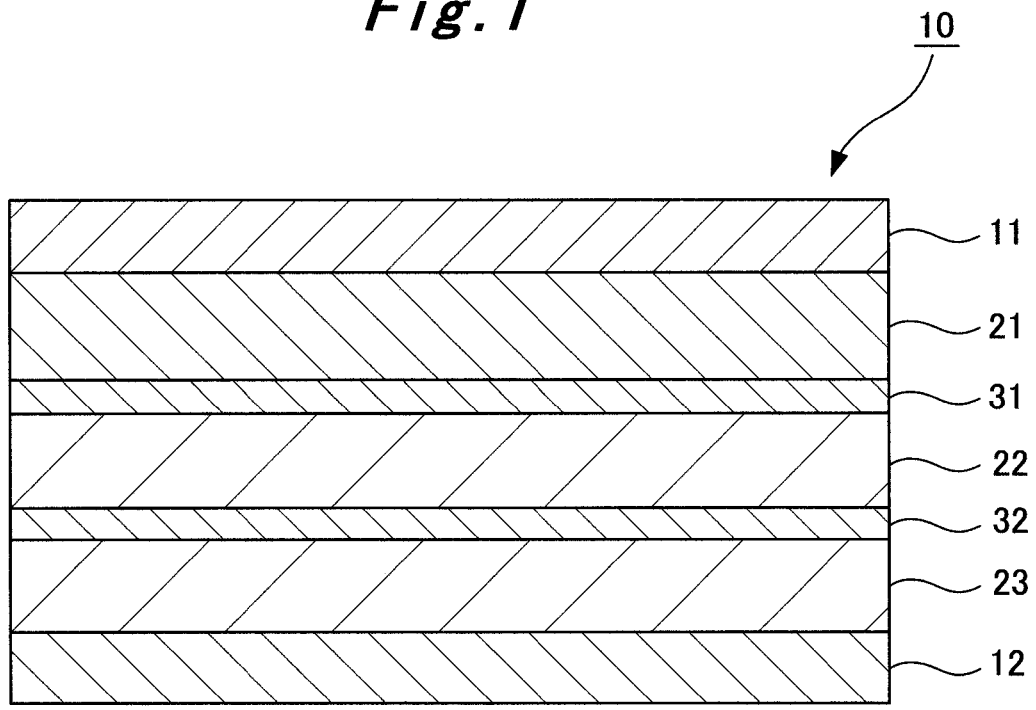
FIG. 1 is a schematic cross-sectional view illustrating one embodiment of an element structure of an organic EL element in the present invention.

An embodiment of an organic electroluminescent (EL) element and a lighting device in the present invention is described in detail with reference to the drawings.

Note that, for the sake of convenience, in the drawings used in the following description, characteristic parts are sometimes illustrated in an enlarged manner to facilitate understanding of characteristics, and proportions of dimensions of constitutional elements and the like are not always the same as actual ones. Moreover, materials, dimensions, and the like exemplified in the following description are merely examples and the present invention are not necessarily limited to those and can be carried out with the materials, dimensions, and the like appropriately changed within a scope not changing the spirit of the invention.

[Organic Electroluminescent Element (Organic EL Element)]

FIG. 1 is a schematic cross-sectional view illustrating one embodiment of an element structure of an organic EL element in the present invention.

As illustrated in FIG. 1, the organic EL element 10 of the embodiment has a structure in which multiple light emitting units 21, 22, 23 each including a light emitting layer made of at least an organic compound are stacked one on top of another between a cathode 11 and an anode 12 and charge generating layers (CGL) 31, 32 are each sandwiched between a corresponding pair of the adjacent light emitting units, and is an organic EL element capable of providing white light by causing the multiple light emitting units 21, 22, 23 to emit light.

The organic EL element 10 of the embodiment includes a first light emitting unit 21, a second light emitting unit 22, and a third light emitting unit 23.

The first light emitting unit 21 includes a light emitting layer formed of a red phosphorescent light emitting layer which emits red light with one peak wavelength in a red wavelength band and a green phosphorescent light emitting layer which emits green light with one peak wavelength in a green wavelength band.

The second light emitting unit 22 includes a light emitting layer formed of a blue fluorescent light emitting layer which emits blue light with one or two peak wavelengths in a blue wavelength band.

The third light emitting unit 23 includes a light emitting layer formed of a blue fluorescent light emitting layer which emits blue light with one or two peak wavelengths in the blue wavelength band.

The first light emitting unit 21 and the second light emitting unit 22 are stacked one on top of the other with a first charge generating layer 31 sandwiched therebetween.

The second light emitting unit 22 and the third light emitting unit 23 are stacked one on top of the other with a second charge generating layer 32 sandwiched therebetween.

The organic EL element 10 of the embodiment has a structure in which the anode 12, the third light emitting unit 23, the second charge generating layer 32, the second light emitting unit 22, the first charge generating layer 31, the first light emitting unit 21, and the cathode 11 are stacked one on top of another in this order. Specifically, the organic EL element 10 of the embodiment has a structure in which the first light emitting unit 21, the second light emitting unit 22, and the third light emitting unit 23 are stacked one on top of another with each of the first charge generating layer 31 and the second charge generating layer 32 sandwiched between the corresponding pair of adjacent light emitting units (MPE structure).

In the organic EL element 10 of the embodiment, the white light provided by light emission of the first light emitting unit 21, the second light emitting unit 22, and the third light emitting unit 23 has an emission spectrum continuous over a wavelength band of at least 380 nm to 780 nm. Moreover, in the organic EL element 10 of the embodiment, this emission spectrum has one peak wavelength in the red wavelength band of 590 nm to 640 nm, one peak wavelength in the green wavelength band of 500 nm to 550 nm, one or two peak wavelengths in the blue wavelength band of 440 nm to 490 nm.

A metal with a small work function, an alloy of this metal, a metal oxide, or the like may be generally used as the cathode 11. For example, as a metal forming the cathode 11, a metal single substance such as an alkaline metal such as Li, an alkaline earth metal such as Mg or Ca, a rare-earth metal such as Eu, or an alloy containing any of these metals and Al, Ag, In, or the like is used.

Alternatively, the cathode 11 may have a configuration in which an organic layer doped with a metal is used in an interface between the cathode 11 and an organic layer as disclosed in, for example, "Japanese Patent Application Publication No. Hei 10-270171" and "Japanese Patent Application Publication No. 2001-102175." In this case, an electrically conductive material is used as the material of the cathode 11 and the properties of the material such as the work function are not limited to particular properties.

As another alternative, the cathode 11 may have a configuration in which an organic layer in contact with the cathode 11 is made of an organic metal complex compound containing at least one type selected from the group consisting of alkali metal ions, alkaline earth metal ions, and rare-earth metal ions as disclosed in, for example, "Japanese Patent Application Publication No. Hei 11-233262" and "Japanese Patent Application Publication No. 2000-182774." In this case, a metal which is capable of reducing the metal ions contained in the organic metal complex compound to metal in vacuum, for example, a metal (with a thermal reduction property) such as Al, Zr, Ti, and Si or an alloy containing any of these metals can be used as the cathode 11. Among these, Al which is generally widely used as a wiring electrode may be used from the viewpoint of ease of vapor deposition, high light reflectance, chemical stability, and the like.

The material of the anode 12 is not limited to a particular material. When light is to be extracted from the anode 12 side, a transparent, electrically conductive material such as, for example, ITO (Indium Tin Oxide) or IZO (Indium Zinc Oxide) is used.

When an ITO film is formed as the anode 12 by using a sputtering method which do not damage an organic film by employing a method disclosed in, for example, "Japanese Patent Application Publication No. 2002-332567," the aforementioned transparent electrically conductive material such as ITO or IZO can be used as the cathode 11 by using the aforementioned organic layer doped with a metal which is disclosed in "Japanese Patent Application No. Hei 10-270171" as an electron injection layer.

Accordingly, it is possible to manufacture a transparent organic EL element 10 by forming both of the cathode 11 and the anode 12 to be transparent (because the first light emitting unit 21, the second light emitting unit 22, the third light emitting unit 23, the first charge generating layer 31, and the second charge generating layer 32 are similarly transparent). Moreover, the light can be extracted from the cathode 11 side by forming the anode 12 with the metal material and forming the cathode 11 with the transparent, electrically conductive material, which is the opposite of a general organic EL element. Furthermore, the order of film formation does not have to start from the anode 12 side and may start from the cathode 11 side.

The first light emitting unit 21, the second light emitting unit 22, and the third light emitting unit 23 may employ various structures as in the conventionally well-known organic EL element 10 and may each have any layered structure as long as it includes the light emitting layer made of at least an organic compound. For example, the arrangement may be such that an electron transport layer, an electron injection layer, and the like are arranged on the cathode 11 side of each light emitting layer and a hole transport layer, a hole injection layer, and the like are arranged on the anode 12 side of the light emitting layer.

The electron transport layers are made of, for example, a conventionally well-known electron transport material. In the organic EL element 10 of the embodiment, an electron transport material with a relatively deep HOMO (Highest Occupied Molecular Orbital) level may be used out of electron transport materials generally used for organic EL elements. Specifically, an electron transport material with a HOMO level of at least about 6.0 eV may be used.

Each of the electron injection layers is provided between the cathode 11 and the electron transport layer or between at least one of the first charge generating layer 31 and the second charge generating layer 32 and the electron transport layer located on the anode 12 side to improve injection efficiency of electrons from the cathode 11 or at least one of the first charge generating layer 31 and the second charge generating layer 32. An electron transport material having properties similar to the electron transport layers is generally used as the material of the electron injection layers. The electron transport layers and the electron injection layers are sometimes collectively referred to as electron transport layers.

The hole transport layers are made of, for example, a conventionally well-known hole transport material. The hole transport material is not limited to a particular material. For example, an organic compound (electron donating material) which has an ionization potential less than 5.7 eV and which has a hole transport property, that is an electron donating property may be used as the hole transport material.

Each of the hole injection layers is provided between the anode 12 and the hole transport layer or between at least one of the first charge generating layer 31 and the second charge generating layer 32 and the hole transport layer located on the cathode 11 side to improve injection efficiency of holes from the anode 12 or at least one of the first charge generating layer 31 and the second charge generating layer 32. An electron donating material having properties similar to the hole transport layers is generally used as the material of the hole injection layers. The hole transport layers and the hole injection layers are sometimes collectively referred to as hole transport layers.

The red phosphorescent light emitting layer and the green phosphorescent light emitting layer included in the first light emitting unit 31 generally each contain a host material which is a main component and a guest material which is a minor component as the organic compound. Emission of the red light and the green light is attributable particularly to the properties of the guest materials.

A material with an electron transport property, a material with a hole transport property, a material obtained by mixing these materials, or the like is used as the host material of each of the red phosphorescent light emitting layer and the green phosphorescent light emitting layer.

Specifically, for example, 4,4'-biscarbazolylbiphenyl (CBP), 2,9-dimethyl-4,7-diphenyl-9,10-phenanthroline (BCP), or the like is used as the host material of each phosphorescent light emitting layer.

The guest material is also referred to as dopant material. The guest material utilizing phosphorescent light emission is generally referred to as phosphorescent light emitting material. A light emitting layer made of the phosphorescent light emitting material is referred to as phosphorescent light emitting layer.

In the phosphorescent light emitting layer, it is possible to utilize not only 75% of triplet excitons, which are generated by recombination of electrons and holes, but also 25% of the triplet excitons, which are generated by energy transfer from singlet excitons. Accordingly, an internal quantum efficiency of 100% can be achieved in theory. Specifically, the excitons generated by the recombination of electrons and holes are converted to light in the light emitting layer without thermal quenching or the like. In an organic metal complex including heavy atoms such as iridium or platinum, an internal quantum efficiency close to 100% is actually achieved by optimization of the element structure and the like.

The guest material of each phosphorescent light emitting layer is not limited to a particular material.

For example, a red phosphorescent light emitting material such as $Ir(piq)_3$, $Ir(btpy)_3$, $Ir(btp)_2acac$, or $Ir(2-phq)_2acac$ is used as the guest material of the red phosphorescent light emitting layer.

For example, a green phosphorescent light emitting material such as $Ir(ppy)_3$ is used as the guest material of the green phosphorescent light emitting layer.

The blue fluorescent light emitting layer included in each of the second light emitting unit 22 and the third light emitting unit 23 generally contains a host material which is a main component and a guest material which is a minor component as the organic compound. Emission of the blue light is attributable particularly to the properties of the guest material.

For example, blue fluorescent light emitting materials described in paragraphs [0052] to [0061] of "International Patent Application Publication No. WO2012/053216" is used as the host material and the guest material of the blue fluorescent light emitting layer.

For example, a styrylamine compound, a fluoranthene compound, an aminopyrene compound, a boron complex, or the like can be used as the guest material of the blue fluorescent light emitting layer. Furthermore, a material such as 4,4'-bis[4-(diphenylamino)styryl]biphenyl (BDAVBi) or 2,7-bis{2-[phenyl(m-tolyl)amino]-9,9-dimethyl-fluoren-7-yl}-9,9-dimethyl-fluorene (MDP3FL) can be used.

For example, a vacuum deposition method, a spin coating method, or the like is used as a film forming method for layers forming the first light emitting unit 21, the second light emitting unit 22, and the third light emitting unit 23.

The first charge generating layer 31 and the second charge generating layer 32 are each formed of an electrically insulating layer made of an electron accepting material and an electron donating material. The specific resistance of the electrically insulating layer may be preferably $1.0 \times 10^2$ Ω·cm or more, or more preferably $1.0 \times 10^5$ Ω·cm or more.

Moreover, the first charge generating layer 31 and the second charge generating layer 32 may each be configured such that the charge generating layer is formed of mixed layers of different materials, one component of the mixed layers is a metal oxide, and this metal oxide forms a charge transfer complex by redox. In this case, when voltage is applied between the cathode 11 and the anode 12, charges in the charge transfer complex move toward each of the cathode 11 side and the anode 12 side. This causes holes to be injected into the second light emitting unit 22 located on the cathode 11 side of the second charge generating layer 32 and into the first light emitting unit 21 located on the cathode 11 side of the first charge generating layer 31 and causes electrons to be injected into the third light emitting unit 23 located on the anode 12 side of the second charge generating layer 32 and into the second light emitting unit 22 located on the anode 12 side of the first charge generating layer 31.

Holes are injected into one light emitting unit (first light emitting unit 21 or second light emitting unit 22) located on the cathode 11 side of the second charge generating layer 32 and electrons are injected into another light emitting unit (third light emitting unit 23) located on the anode 12 side of the second charge generating layer 32. Light emission from the first light emitting unit 21, the second light emitting unit 22, and the third light emitting unit 23 can be thereby simultaneously achieved at the same current amount. Accordingly, a current efficiency and an external quantum efficiency equal to the sum of light emission efficiencies of the first light emitting unit 21, the second light emitting unit 22 and the third light emitting unit 23 can be obtained.

The first charge generating layer 31 and the second charge generating layer 32 may each be a laminate of an electron accepting material and an electron donating material. Effects similar to those described in the preceding paragraph can be obtained also in this case.

For example, materials described in aforementioned Patent Document 1 are used as materials forming the first charge generating layer 31 and the second charge generating layer 32. Among these, materials described in paragraphs [0019] to [0021] are preferably used. Alternatively, materials described in paragraphs [0023] to [0026] of "International Patent Application Publication No. WO2010/113493" are used as materials forming the first charge generating layer 31 and the second charge generating layer 32. Among these, a strong electron accepting material (HATCN6) described in paragraphs [0059] in particular has been a material frequently used for the first charge generating layer 31 and the second charge generating layer 32 in recent years.

A compound having a structure expressed by the following formula (1) may also be used as the material forming the first charge generating layer 31 and the second charge generating layer 32. Note that, when the substituent groups represented by R in the structure expressed by the following formula (1) are CN (cyano groups), this compound is HATCN6 described above.

[Chem. 2]

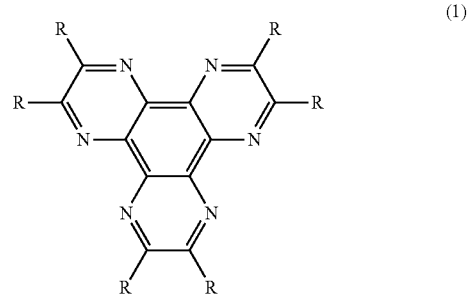

(1)

where R represents an electron withdrawing group of F, Cl, Br, I, CN, $CF_3$.

Figure 2:
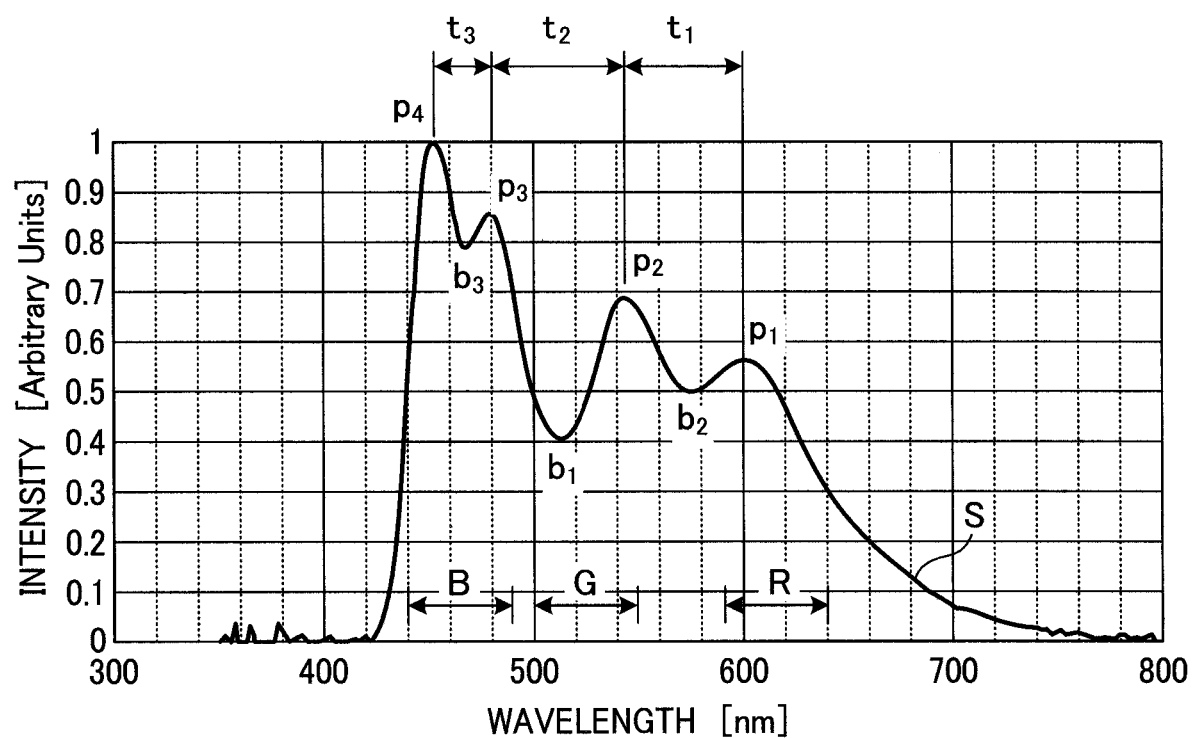
FIG. 2 is a graph illustrating an example of an emission spectrum of white light provided by the one embodiment of the organic EL element in the present invention.

FIG. 2 is a graph depicting an example of an emission spectrum of white light provided by the organic EL element 10 of the embodiment.

Specifically, as illustrated in FIG. 2, the white light provided by the organic EL element 10 has an emission spectrum S continuous over the wavelength band of at least 380 nm to 780 nm as so-called visible light.

The emission spectrum S has one peak wavelength $p_1$ in the red wavelength band R of 590 nm to 640 nm, one peak wavelength $p_2$ in the green wavelength band G of 500 nm to 550 nm, and one peak wavelength $p_3$ or two peak wavelengths $p_3$, $p_4$ in the blue wavelength band B of 440 nm to 490 nm.

As illustrated in FIG. 2, the emission spectrum S may have one bottom wavelength $b_1$ between the two adjacent peak wavelengths $p_2$, $p_3$ in a blue wavelength band and a green wavelength band of 500 nm to 520 nm.

Both of high luminance light emission and an excellent color rendering property can be thereby achieved by appropriately controlling a ratio of the emission intensity between the peak wavelength $p_2$ with a high luminosity function and the peak wavelength $p_3$ including a short wavelength component.

Moreover, as illustrated in FIG. 2, the emission intensity of the one bottom wavelength $b_1$ in the blue wavelength band and the green wavelength band of 500 nm to 520 nm may be lower than the emission intensities of bottom wavelengths $b_2$, $b_3$ in the other wavelength bands (green wavelength band, red wavelength band, blue wavelength band).

A color temperature of the white light suitable for lighting can be thereby achieved by appropriately setting an emission intensity ratio between the peak wavelengths $p_1$ and $p_2$ forming the bottom wavelength $b_2$ and an emission intensity ratio between the peak wavelengths $p_3$ and $p_4$ forming the bottom wavelength $b_3$.

For example, a ratio of (B) to (A) ((B)/(A)) may be 0.50 or smaller, where (A) is the emission intensity of the peak wavelength having the highest emission intensity in the wavelength band of 380 nm to 780 nm (peak wavelength $p_4$ in FIG. 2) and (B) is the emission intensity of the one bottom wavelength $b_1$ in the blue wavelength band and the green wavelength band of 500 nm to 520 nm. The organic EL element 10 can thereby achieve both of the high luminance light emission and the excellent color rendering property and achieve the color temperature of white light suitable for lighting.

Moreover, an interval between the one bottom wavelength $b_1$ between the peak wavelengths $p_1$, $p_2$ adjacent to each other in the red wavelength band and the green wavelength band and the one bottom wavelength $b_2$ in the blue wavelength band and the green wavelength band of 500 nm to 520 nm may be preferably 50 nm or more, or more preferably 60 nm or more.

This can prevent a decrease in the color rendering property caused by the peak wavelength $p_3$ in the blue wavelength band being too close to the peak wavelength $p_1$ in the red wavelength band and the peak wavelength $p_2$ in the green wavelength band.

Moreover, the blue light emitted by each blue fluorescent light emitting layer is an important factor for obtaining the white light with the high color temperature and the excellent color rendering property. Specifically, the emission spectrum S may have the one peak wavelength p or the two peak wavelengths $p_3$, $p_4$ in the blue wavelength band of 440 nm to 490 nm.

The organic EL element 10 of the embodiment can thereby provide the white light with the high color temperature and the excellent color rendering property. Specifically, the organic EL element 10 of the embodiment can provide the white light with a light color falling under one of daylight (D), neutral white (N), and white (W) among chromaticity ranges specified in "JIS Z 9112." Moreover, the organic EL element 10 of the embodiment can provide the white light with an average color rendering index (Ra) of 70 or more or 80 or more.

Since the organic EL element 10 of the embodiment can provide the white light with the high color temperature and the excellent color rendering property as described above, the organic EL element 10 is preferably used as, for example, a light source of a backlight of a liquid crystal display or a lighting device such as a general lighting unit. Specifically, a lighting device including the organic EL element 10 of the embodiment can provide lighting using the white light with the high color temperature and the excellent color rendering property. Moreover, application of the organic EL element 10 of the embodiment is not limited to the light source of the lighting device and can be used in various applications.

[Lighting Device]

A lighting device of the embodiment includes the aforementioned organic EL element 10 of the embodiment.

The lighting device of the embodiment may have a configuration including an optical film for improving the color rendering property, on the light extraction surface side of the aforementioned organic EL element 10 of the embodiment.

Generally, the color rendering property is evaluated by using the average color rendering index (Ra), and the average color rendering index (Ra) is expressed as an average value of eight types of color rendering indices (R1 to R8). In addition to these, there are seven types of color rendering indices such as R9 for evaluating color reproduction of red, R13 for evaluating reproduction of Caucasian skin color, R15 for evaluating color reproduction of Japanese skin color, and the like.

The optical film used in the lighting device of the embodiment is provided to cover a valley (bottom wavelength $b_2$) appearing in a wavelength band of 540 nm to 580 nm in the aforementioned emission spectrum S and improve the color temperature and deviation while maintaining the color rendering property.

Moreover, an organic EL element generally emits light in a light emitting layer with a higher refractive index (refractive index of about 1.6 to 2.1) than air and it is said that only about 15% to 20% of light emitted from the light emitting layer can be extracted. This is because: light incident on an interface at an angle equal to or greater than a critical angle is totally reflected and cannot be extracted from the element; and light is totally reflected between a transparent substrate and a transparent electrode or the light emitting layer to be guided through the transparent electrode or the light emitting layer and resultantly escapes in a direction toward side surfaces of the element.

As a method for improving the extraction efficiency of the light, there are, for example, the following methods: a method of making a surface of the transparent substrate rough to prevent total reflection on an interface between the transparent substrate and air (see, for example, "U.S. Pat. No. 4,774,435"); a method of providing a light condensing property to the substrate to improve the efficiency (see, for example, "Japanese Patent Application Publication No. Sho 63-314795"); a method of forming reflection surfaces on the side surfaces of the element and the like (see, for example, "Japanese Patent Application Publication No. Hei 1-220394"); a method of introducing a flat layer with an intermediate refractive index between the substrate and the light emitting body to form a reflection prevention film (see, for example, "Japanese Patent Application Publication No. Sho 62-172691"); a method of introducing a flat layer with a lower refractive index than the substrate, between the substrate and the light emitting body (see, for example, "Japanese Patent Application Publication No. 2001-202827"); and a method of forming a diffraction grading between any two of the substrate, the transparent electrode layer, and the light emitting layer (including between the substrate and the outside) (see, for example, "Japanese Patent Application Publication No. Hei 11-283751").

Note that, in order to improve the aforementioned color rendering property, the lighting device may have a structure in which a microlens array or the like is further provided on a surface of the aforementioned optical film. Moreover, the lighting device may be combined with a light condensing sheet to condense the light in a specific direction, for example, a forward direction relative to the element light emitting surface, and thereby improve the luminance in the specific direction. Furthermore, a light diffusion film may be used together with the light condensing sheet to control a light emission angle from the organic EL element. For example, a light diffusion film (LIGHT-UP) manufactured by Kimoto Co., Ltd. or the like is used as the light diffusion film.

The lighting device of the embodiment can provide the white light with the high color temperature and the excellent color rendering property. Specifically, the lighting device of the embodiment can provide the white light with a light color falling under of one of daylight (D), neutral white (N), and white (W) among chromaticity ranges specified in "JIS Z 9112." Moreover, the lighting device of the embodiment can provide the white light with an average color rendering index (Ra) of 80 or more or 85 or more.

In the lighting device of the embodiment, R13 and R15 among the color rendering indices of the white light may each be preferably 70 or more, or more preferably 80 or more.

Note that the present invention is not necessarily limited to the aforementioned embodiment and various changes can be made within a scope not departing from the spirit of the present invention.

Specifically, although the organic EL element of the embodiment preferably employs the aforementioned element structure illustrated in FIG. 1 as the element structure for providing the white light having the emission spectrum S with the high color temperature and the excellent color rendering property as illustrated in FIG. 2, the element structure is not necessarily limited to that described above. Specifically, the element structure of the organic EL element of the embodiment can be any structure as long as it provides the white light having the emission spectrum S with the high color temperature and the excellent color rendering property as illustrated in FIG. 2, and various element structures and materials can be employed to achieve such white light.

EXAMPLES

Effects of the present invention are made clearer below by using Examples.

Note that the present invention is not limited to following Examples and changes can be made as appropriate within a scope not departing from the spirit of the invention.

Example 1

"Manufacturing of Organic EL Element"

In Example 1, an organic EL element having an element structure illustrated in FIG. 3 was manufactured.

Specifically, first, there was prepared a soda-lime glass substrate with a thickness of 0.7 mm on which an ITO film with a thickness of 100 nm, a width of 2 mm, and a sheet resistance of about 20Ω/□ was formed.

Then, the substrate was subjected to ultrasonic cleaning by using neutral detergent, ion-exchanged water, acetone, and isopropyl alcohol for 5 minutes for each cleaner and then subjected to spin drying and UV/$O_3$ treatment.

Next, vapor deposition crucibles (made of tantalum or alumina) in a vacuum deposition apparatus were filled respectively with materials used to form layers illustrated in FIG. 3. Then, the substrate was set in the vacuum deposition apparatus, electric power was supplied to the vapor deposition crucibles to heat them in a reduced pressure atmosphere with a degree of vacuum of $1 \times 10^{-4}$ Pa or less, and each of the layers was vapor-deposited to a predetermined film thickness at a deposition rate of 0.1 nm per second. Moreover, each of the layers made of two or more materials such as the light emitting layers was formed by supplying power to the corresponding vapor deposition crucibles and performing co-deposition such that the layer is formed to have a predetermined mix ratio.

Moreover, the cathode was vapor-deposited to a predetermined film thickness at a deposition rate of 1 nm per second.

"Evaluation of Organic EL Element"

The organic EL element of Example 1 manufactured as described above was connected to a power supply (KEITHLEY 2425) and power with a constant current of 3 mA/cm$^2$ was supplied to the organic EL element of Example 1 to cause it to emit light. An emission spectrum of light emitted from the organic EL element in a forward direction in this case was measured by using a multichannel analyzer (trade name: PMA-11, manufactured by Hamamatsu Photonics K.K.)

Then, the emitted light color was evaluated based on the measurement result by using chromaticity coordinates in the CIE color system. Moreover, the emitted light color was classified into one of light source colors specified in "JIS Z 9112" based on the chromaticity coordinates. Furthermore, the deviation duv from a black body locus was derived based on the specifications of "JIS Z 8725." Moreover, the average color rendering index (Ra) of the emitted light color was derived by using the method specified in "JIS Z 8726." The results of these evaluations are collectively illustrated in FIG. 4.

Example 2

An organic EL element of Example 2 having an element structure illustrated in FIG. 5 was manufactured by using a manufacturing method similar to that of Example 1.

Then, the organic EL element of Example 2 was evaluated in methods similar to those in Example 1. The results of the evaluations are illustrated in FIG. 6.

Figure 4:
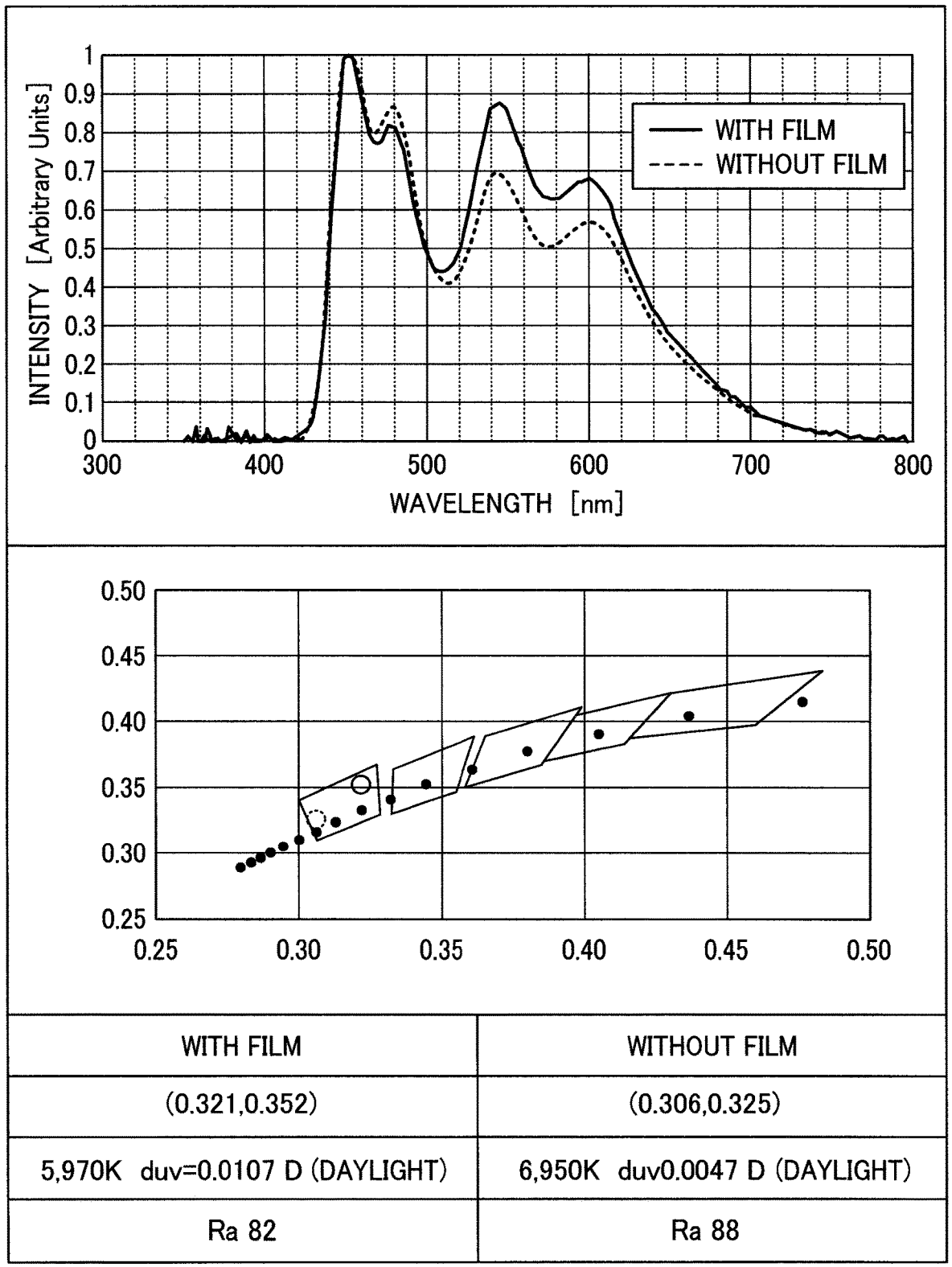
FIG. 4 is a view illustrating evaluation results of organic EL elements in Examples 1 and 3.
Figure 6:
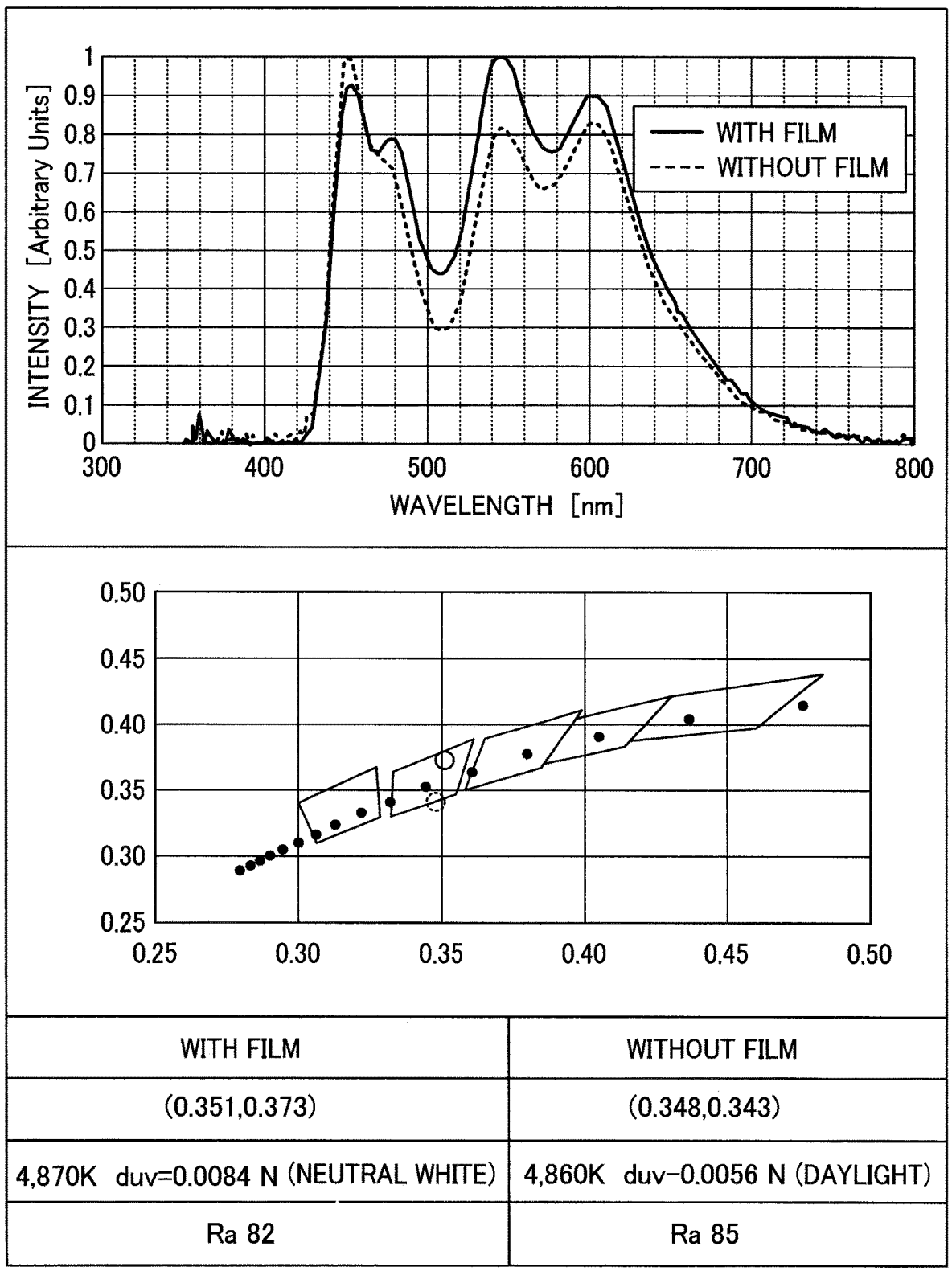
FIG. 6 is a view illustrating evaluation results of organic EL elements in Examples 2 and 4.

As illustrated in FIGS. 4 and 6, the organic EL elements of Examples 1 and 2 both provided the white light with the high color temperature and the excellent color rendering property. Accordingly, it was found that a lighting device including such an organic EL element of the present invention can provide lighting using the white light with the high color temperature and the excellent color rendering property.

Example 3

There was manufactured a lighting device in which an optical film was attached to the light extraction surface (anode) side of the aforementioned organic EL element of Example 1.

Then, the lighting device of Example 3 was evaluated in methods similar to those in Example 1. The results of the evaluations are illustrated in FIG. 4.

Example 4

There was manufactured a lighting device in which an optical film was attached to the light extraction surface (anode) side of the aforementioned organic EL element of Example 2.

Then, the lighting device of Example 4 was evaluated in methods similar to those in Example 1. The results of the evaluations are illustrated in FIG. 6.

As illustrated in FIGS. 4 and 6, it was found that, in the lighting devices of Examples 3 and 4, attaching the optical film to the light extraction surface side (anode) of the organic EL element changed the shape of the emission spectrum from that in the case were no optical film was attached (illustrated by broken lines in FIGS. 4 and 6). Particularly, it was found that the emission intensities of the two peak wavelengths appearing in the green wavelength band and the red wavelength band were higher relative to those in the case without the optical film.

As a result, Ra in the lighting device of Example 3 was 82 and Ra in the lighting device of Example 4 was 82. Hence, a very good color rendering property was obtained in both Examples.

Example 5

A lighting device of Example 5 having an element structure illustrated in FIG. 7 was manufactured by using a manufacturing method similar to that in Example 1.

Figure 8:
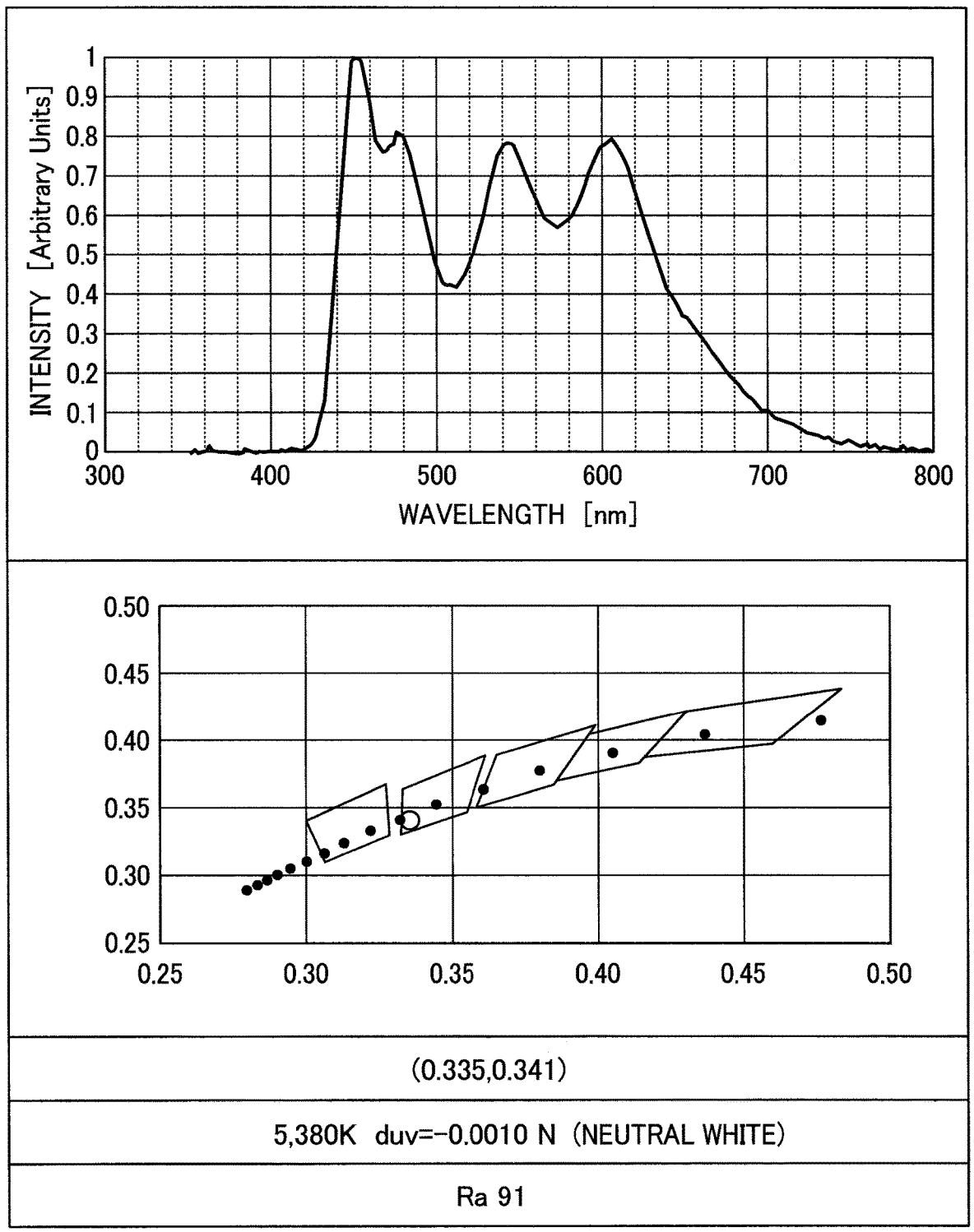
FIG. 8 is a view illustrating evaluation results of the lighting device in Example 5.

Then, the lighting device of Example 5 was evaluated in methods similar to those in Example 1. The results of the evaluations are illustrated in FIG. 8.

Example 6

A lighting device of Example 6 having an element structure illustrated in FIG. 9 was manufactured by using a manufacturing method similar to that in Example 1.

Then, the lighting device of Example 6 was evaluated in methods similar to those in Example 1. The results of the evaluations are illustrated in FIG. 10.

Figure 10:
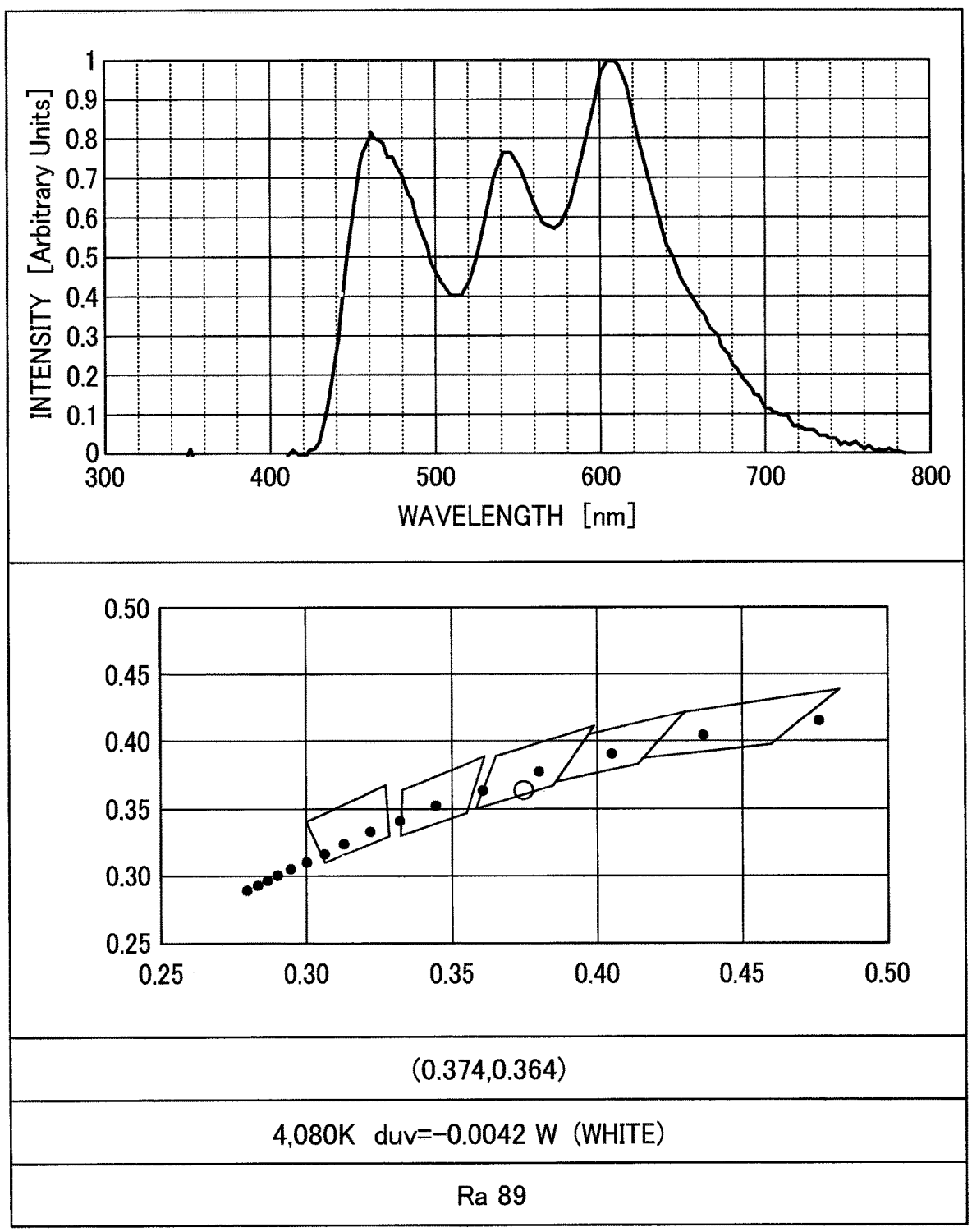
FIG. 10 is a view illustrating evaluation results of the lighting device in Example 6.

As illustrated in FIGS. 8 and 10, the lighting devices of Examples 5 and 6 both provided the white light with the high color temperature and the excellent color rendering property. Accordingly, it was found that such a lighting device including the organic EL element of the present invention can provide lighting using the white light with the high color temperature and the excellent color rendering property.

Example 7

A lighting device of Example 7 having an element structure illustrated in FIG. 11 was manufactured by using a manufacturing method similar to that in Example 1.

Figure 12:
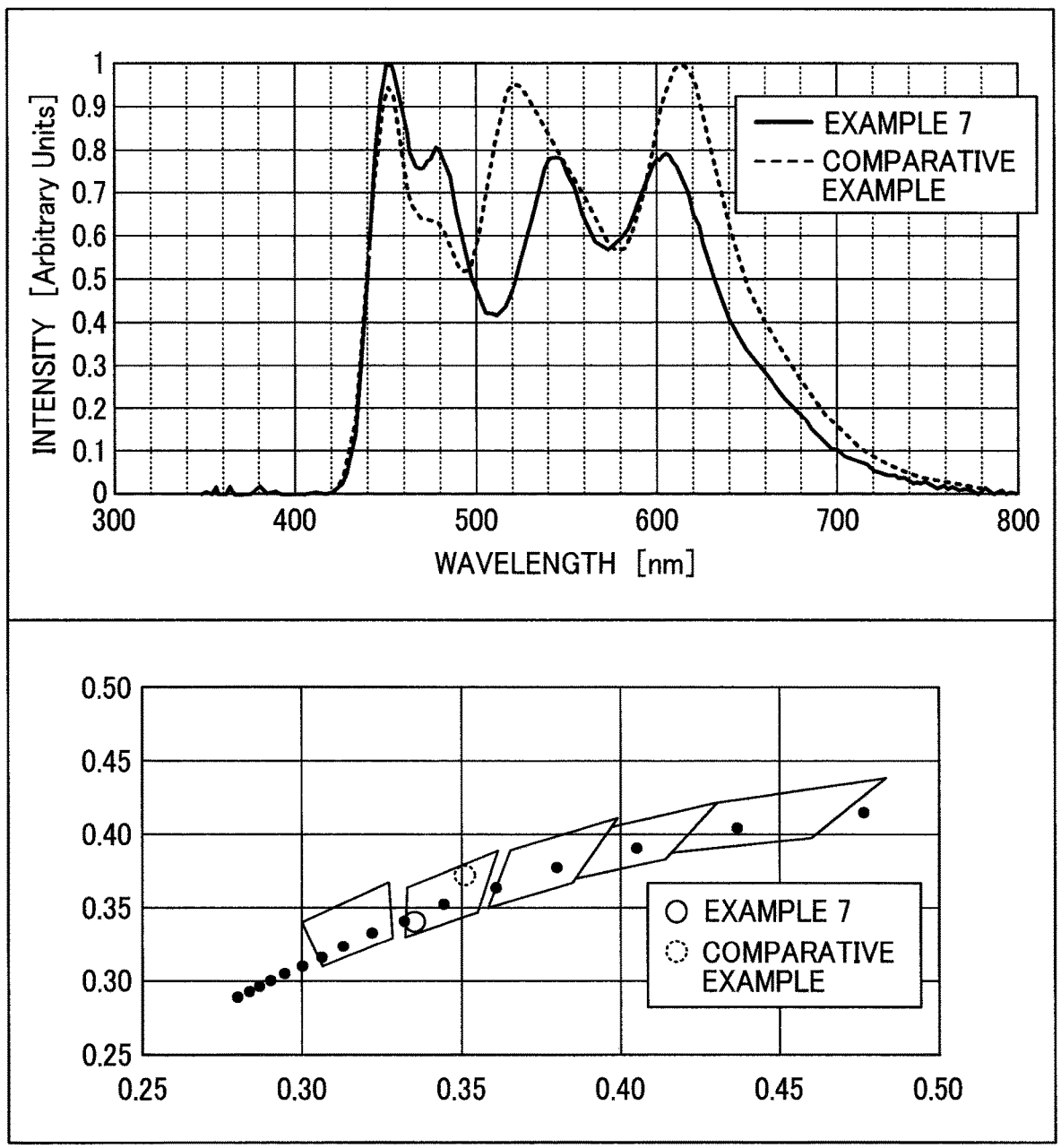
FIG. 12 is a view illustrating evaluation results of lighting devices in Example 7 and Comparative Example.

Then, the lighting device of Example 7 was evaluated in methods similar to those in Example 1. The results of the evaluations are illustrated in FIG. 12.

Comparative Example

Figures 13, 14:
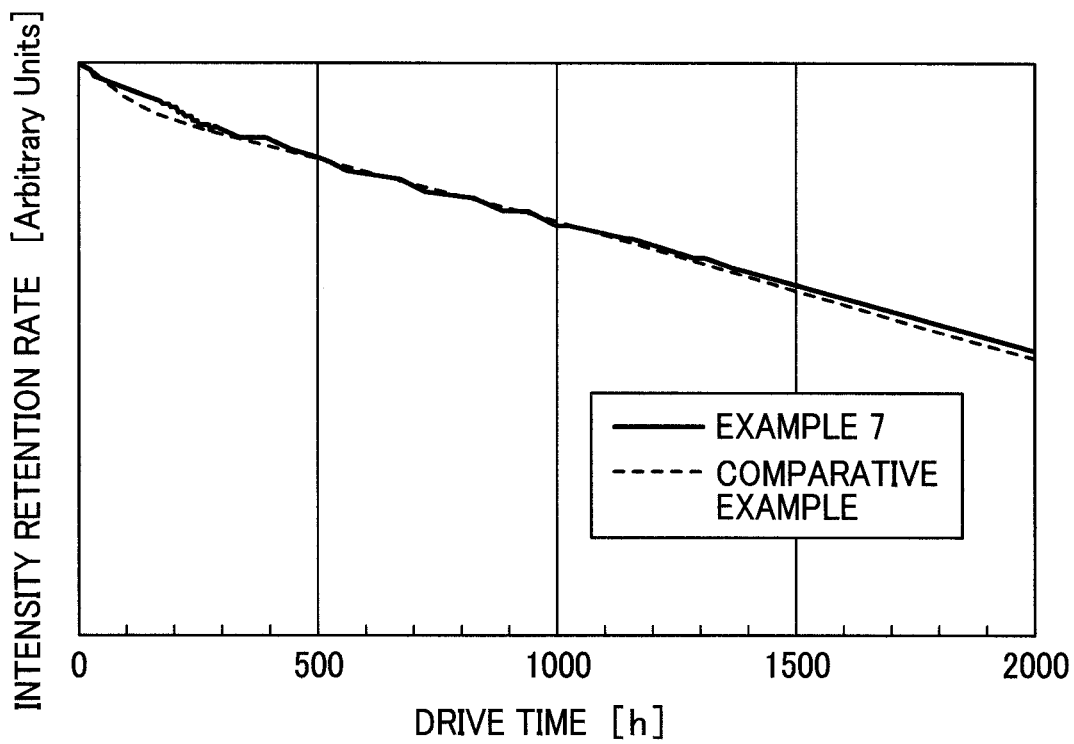
FIG. 13 is a cross-sectional view illustrating an element structure of a lighting device in Comparative Example.
FIG. 14 is a view illustrating evaluation results of life characteristics for the lighting devices of Example 7 and Comparative Example.

A lighting device of Comparative Example having an element structure illustrated in FIG. 13 was manufactured by using a manufacturing method similar to that in Example 1.

Then, the lighting device of Comparative Example was evaluated in methods similar to those in Example 1. The results of the evaluations are illustrated in FIG. 12.

[Evaluation of Lighting Devices of Example 7 and Comparative Example]

The luminance was measured for each of the lighting devices of Example 7 and Comparative Example. The results are illustrated in Table 1. Note that, in Table 1, the luminance of the lighting device of Example 7 is a relative value based on the luminance of the lighting device of Comparative Example.

The correlated color temperature (K) was measured for each of the lighting devices of Example 7 and Comparative Example. The results are illustrated in Table 1. The emitted light color was measured for each of the lighting devices of Example 7 and Comparative Example. The results are illustrated in Table 1.

Moreover, xy chromaticity coordinates were measured for each of the lighting devices of Example 7 and Comparative Example. The results are illustrated in Table 1.

The lighting devices of Example 7 and Comparative Example were each connected to a power supply (KEITHLEY 2425) and power with a constant current of 3 mA/cm$^2$ was supplied to each of the lighting devices of Example 7 and Comparative Example to cause it to emit light. An emission spectrum of light emitted from each lighting device in a forward direction in this case was measured by using a multichannel analyzer (trade name: PMA-11, manufactured by Hamamatsu Photonics K.K.). Then, the deviation duv from a black body locus was derived from the measurement result based on the specifications of "JIS Z 8725." Moreover, the average color rendering index (Ra) of the emitted light color was derived by using the method specified in "JIS Z 8726." The results are illustrated in Table 1.

[Evaluation of Life Characteristics for Lighting Devices of Example 7 and Comparative Example]

The lighting devices of Example 7 and Comparative Example were each connected to a power supply control unit (trade name: PEL-100 TB, manufactured by EHC K.K.) and power with a constant current of 10 mA/cm$^2$ and power with a constant current of 20 mA/cm$^2$ were supplied to each lighting device to perform an accelerated life test of the lighting device.

Luminance and an emission spectrum of light emitted from each lighting device in a forward direction in this case were measured by using luminance values obtained by a spectroradiometer (trade name: SR-3AR, manufactured by Topcon Technohouse Corporation) at predetermined elapsed times, and a decrease rate of the luminance at each elapsed time was calculated.

Since data on the luminance decrease rate obtained in the aforementioned accelerated test was measured with the luminance of the lighting device being higher than predetermined luminance required in Comparative Example and Example, an acceleration coefficient B was calculated by using the following formula:

$$(\alpha/\beta)=(20 \div 10)^B$$

where $\alpha$ is life of the lighting device in the case where it is driven at the current density of 10 mA/cm$^2$ and $\beta$ is life of the lighting device in the case where it is driven at the current density of 20 mA/cm$^2$.

Then, current densities X and Y required to achieve the predetermined luminance respectively in Comparative Example and Example 7 were calculated and life estimation curves at the predetermined luminance was calculated by using the following power functions. The results are illustrated in FIG. 14.

$\alpha \times (10/X)^B$ — Estimated Life of Comparative Example $\alpha \times (10/Y)^B$ — Estimated Life of Example 7

TABLE 1

| | Example 7 | Comparative Example |
|---|---|---|
| Relative luminance | 1.60 | 1.00 |
| Correlated color temperature (K) | 5,380 | 4,870 |
| Emitted light color xy chromaticity coordinates | N (Neutral White) (0.335, 0.341) | N (Neutral White) (0.351, 0.372) |
| Average color rendering index (Ra) | 91 | 96 |

As illustrated in FIG. 12 and Table 1, the lighting device of Example 7 provided the white light with the high color temperature and the excellent color rendering property. Accordingly, it was found that such a lighting device including the organic EL element of the present invention can achieve lighting using the white light with the high color temperature and the excellent color rendering property.

Moreover, it was found from the results of FIG. 14 that, although the lighting device of Example 7 has 1.60 times the luminance of the lighting device of Comparative Example, the lighting device of Example 7 could achieve substantially the same luminance life as the lighting device of Comparative Example. In other words, the lighting device of Example 7 can achieve high-luminance and long-life light emission while achieving the high color temperature and the excellent color rendering property.

INDUSTRIAL APPLICABILITY

The present invention can provide an organic electroluminescent element capable of providing white light with a high color temperature and an excellent color rendering property and a lighting device including such an organic electroluminescent element.

DESCRIPTION OF REFERENCE NUMERALS 10 organic electroluminescent element (organic EL element)
11 cathode
12 anode
21 first light emitting unit
22 second light emitting unit
23 third light emitting unit
31 first charge generating layer
32 second charge generating layer

The invention claimed is:

1. An organic electroluminescent element having a structure in which a plurality of light emitting units each including a light emitting layer made of at least an organic compound are stacked one on top of another between a cathode and an anode and a charge generating layer is sandwiched between each pair of the adjacent light emitting units, the organic electroluminescent element capable of providing white light by causing the plurality of light emitting units to emit light, comprising:

a first light emitting unit including a light emitting layer formed of a red phosphorescent light emitting layer which emits red light with one peak wavelength in a red wavelength band and a green phosphorescent light emitting layer which emits green light with one peak wavelength in a green wavelength band;

a second light emitting unit including a light emitting layer formed of a blue fluorescent light emitting layer which emits blue light with one or two peak wavelengths in a blue wavelength band; and a third light emitting unit including a light emitting layer formed of a blue fluorescent light emitting layer which emits blue light with one or two peak wavelengths in the blue wavelength band, wherein the organic electroluminescent element has a structure in which:

the first light emitting unit and the second light emitting unit are stacked one on top of the other with a first charge generating layer sandwiched therebetween and the second light emitting unit and the third light emitting unit are stacked one on top of the other with a second charge generating layer sandwiched therebetween; and the anode, the third light emitting unit, the second charge generating layer, the second light emitting unit, the first charge generating layer, the first light emitting unit, and the cathode are stacked one on top of another in this order, and the white light provided by light emission of the first light emitting unit, the second light emitting unit, and the third light emitting unit has an emission spectrum continuous over a wavelength band of at least 380 nm to 780 nm and the emission spectrum has one peak wavelength in a red wavelength band of 590 nm to 640 nm, one peak wavelength in a green wavelength band of 500 nm to 550 nm, one or two peak wavelengths in a blue wavelength band of 440 nm to 490 nm, and wherein the emission spectrum has one bottom wavelength in a blue wavelength band and a green wavelength band of 500 nm to 520 nm.

2. The organic electroluminescent element according to claim 1, wherein an emission intensity of the one bottom wavelength in the blue wavelength band and the green wavelength band of 500 nm to 520 nm is lower than emission intensities of bottom wavelengths in the other wavelength bands.

3. The organic electroluminescent element according to claim 1, wherein a ratio of (B) to (A) ((B)/(A)) is 0.50 or smaller, where (A) is an emission intensity of a peak wavelength having the highest emission intensity in the wavelength band of 380 nm to 780 nm and (B) is an emission intensity of the one bottom wavelength in the blue wavelength band and the green wavelength band of 500 nm to 520 nm.

4. The organic electroluminescent element according to claim 1, wherein an interval between the one bottom wavelength in the blue wavelength band and the green wavelength band of 500 nm to 520 nm and one bottom wavelength between the peak wavelengths adjacent to each other in the red wavelength band and the green wavelength band is 50 nm or more.

5. The organic electroluminescent element according to claim 1, wherein an emitted light color of the white light is daylight (D) among chromaticity ranges specified in "JIS Z 9112" and an average color rendering index (Ra) of the white light is 70 or more.

6. The organic electroluminescent element according to claim 1, wherein the charge generating layers are each formed of an electrically insulating layer made of an electron accepting material and an electron donating material and a specific resistance of the electrically insulating layer is $1.0 \times 10^2$ Ω·cm or more.

7. The organic electroluminescent element according to claim 1, wherein the charge generating layer are each formed of an electrically insulating layer made of an electron accepting material and an electron donating material, and a specific resistance of the electrically insulating layer is $1.0 \times 10^5$ Ω·cm or more.

8. The organic electroluminescent element according to claim 1, wherein
each of the charge generating layers is formed of mixed layers of different materials, one component of the mixed layers is a metal oxide, and the metal oxide forms a charge transfer complex by redox, and
when voltage is applied between the cathode and the anode, charges in the charge transfer complex move toward each of the cathode side and the anode side to cause holes to be injected into one light emitting unit located on the cathode side of the charge generating layer and cause electrons to be injected into another light emitting unit located on the anode side of the charge generating layer.

9. The organic electroluminescent element according to claim 1, wherein
each of the charge generating layers is formed of a laminate of an electron accepting material and an electron donating material, and
when voltage is applied between the cathode and the anode, in an interface between the electron accepting material and the electron donating material, charges generated by reaction involving movement of electrons between the electron accepting material and the electron donating material move toward each of the cathode side and the anode side to cause holes to be injected into one light emitting unit located on the cathode side of the charge generating layer and cause electrons to be injected into another light emitting unit located on the anode side of the charge generating layer.

10. The organic electroluminescent element according to claim 1, wherein the charge generating layers contain a compound having a structure expressed by the following formula (1):

[Chem. 1]

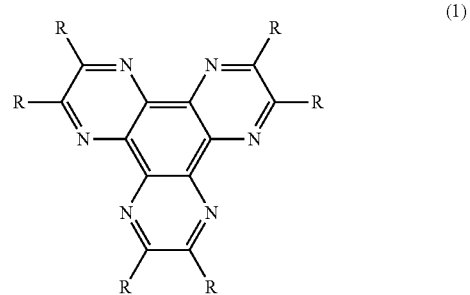

(1)

where R represents an electron withdrawing group of F, Cl, Br, I, CN, CF$_3$.

11. A lighting device comprising the organic electroluminescent element according claim 1.

12. The lighting device according to claim 11, comprising an optical film on a light extraction surface side of the organic electroluminescent element.

13. The lighting device according to claim 11, wherein an emitted light color of the white light is one of daylight (D), neutral white (N), and white (W) among chromaticity ranges specified in "JIS Z 9112" and an average color rendering index (Ra) of the white light is 80 or more.

14. The lighting device according to claim 11, wherein R13 and R15 among color rendering indices of the white light are each 70 or more.

* * * * *